United States Patent [19]

Knauer

[11] 3,937,929

[45] Feb. 10, 1976

[54] METHOD FOR IDENTIFYING SELECTED INVENTORY ITEMS AND READING THE SUM OF THEIR VALUES

[76] Inventor: Peter Knauer, 3223 Royal Oaks Drive, Thousand Oaks, Calif. 91360

[22] Filed: June 18, 1973

[21] Appl. No.: 371,125

[52] U.S. Cl.... 235/61.11 R; 235/61.12 N; 35/31 D; 235/61 M; 235/91 L

[51] Int. Cl.[2] .................... G11C 15/00; G11C 19/06

[58] Field of Search... 235/61.11 A, 61.11 R, 61.12 N, 235/61.6 R, 61 M, 61 PS, 91 L; 40/2 R, 2 B; 215/7; 35/31 D, 31 E, 31 F, 73

[56] References Cited

UNITED STATES PATENTS

| | | | |
|---|---|---|---|
| 2,494,469 | 1/1950 | Booth | 35/31 D |
| 2,586,039 | 2/1952 | Heggedal | 35/73 |
| 2,746,679 | 5/1956 | Stratton et al. | 235/61.6 R |
| 3,061,947 | 11/1962 | Faudree | 35/31 D |
| 3,171,217 | 3/1965 | Birdsall | 35/31 D |
| 3,441,714 | 4/1969 | Simjian | 235/61.11 A |
| 3,526,973 | 9/1970 | Delves | 35/31 E |
| 3,708,892 | 1/1973 | Graf | 35/31 D |
| 3,737,631 | 6/1973 | Harris | 235/91 L |

*Primary Examiner*—Stanley M. Urynowicz, Jr.
*Attorney, Agent, or Firm*—Romney Schaap Golant Scillieri & Ashen

[57] ABSTRACT

A method and apparatus for distributing and controlling inventories of food items and the like in which a plurality of individual elements are coded to identify both a corresponding inventory item and a magnitude such as a price associated with that inventory item. A holder member for collecting together a selected group of the individual elements to enable identification of the corresponding food items ordered by a customer as well as sensing the total price thereof. Coding each element so that one dimension thereof extends in a predetermined direction a distance proportional to the price of the corresponding food item.

1 Claim, 7 Drawing Figures

METHOD FOR IDENTIFYING SELECTED INVENTORY ITEMS AND READING THE SUM OF THEIR VALUES

This invention relates generally to a method and apparatus for distributing and controlling inventory, and more specifically to coded identification elements representing a predetermined inventory of items having an associated magnitude such as a price.

Conventional methods of distributing and controlling inventories usually require an oral or written order which must be communicated from a customer to an inventory clerk. Where there is a plurality of inventory items, much of the clerk's time is wasted in correctly identifying the particular items ordered, tabulating the total price for such inventory items, and keeping records of each transaction for future reference. Thus, such conventional inventory practices are unduly inefficient and inaccurate, and make it very difficult for a small number of inventory clerks such as waitresses in a restaurant to obtain, fill, and keep the necessary records for orders of a large number of customers.

Accordingly, it is a primary object of the present invention to overcome the aforementioned inefficiencies and inaccuracies of prior art inventory distribution methods, and provide an improved method and apparatus for distributing and controlling inventory without requiring a customer to recite the order orally or in writing, while at the same time eliminating the need for a clerk to hear or read such an order.

A further object is to provide a method and apparatus of the aforementioned characteristics wherein a record is kept of the inventory distributed without having to make such record in writing at the time of distribution.

It is another object of the invention to provide individual elements corresponding to each of a predetermined number of inventory items, so that the element correctly identifies both the inventory item itself as well as price.

A further object of the invention is to provide a holder for assembling a selected number of elements in adjacent relationship by a customer so that when such holder and collected elements are presented to an inventory clerk, the identity and price of the corresponding inventory items can be immediately determined.

A more specific object of the invention is to provide a method and apparatus having the aforementioned characteristics in which a dimension of each element is made proportional to the magnitude of the corresponding inventory items. A related object is to provide a holder member for removably mounting a selected choice of individual elements in sequential alignment with their coded dimensions adjacent a scale calibrated to indicate the sum of the magnitudes of the corresponding inventory items.

Another object of the invention is to provide a holder member with a removable sheet for positioning adjacent a group of sequentially aligned elements such that the sum of the magnitudes for an individual order can be recorded by marking the sheet at the end of the aligned elements.

An additional object is to provide an inexpensive and efficient method of inventory control having the aforementioned characteristics which is suitable for use in fast food restaurants, department stores, markets, parts supply houses, warehouses and the like, where a large number of inventory items having individual prices are ordered or purchased by customers and distributed by inventory clerks.

Further purposes, objects, features and advantages of the invention will be evident to those skilled in the art from the following description of the various exemplary embodiments of the invention.

Generally speaking, the invention provides a method of inventory distribution and control in which a plurality of individual elements are each identity-coded with first indicia corresponding to and representing one of a predetermined inventory of items. The elements are also magnitude-coded with second indicia identifying a predetermined number associated with that particular inventory item. A request for distribution of a selected group of inventory items can be made by simply collecting together those individual coded elements which represent the desired inventory items. The person or machine filling the request discerns from the first indicia the correct identity of the inventory items requested, while at the same time automatically sensing from the second indicia the total of the numbers associated with the selected group of inventory items. The inventory items requested are then distributed, after which the individual coded elements can be retained for various accounting purposes.

Figure 3:
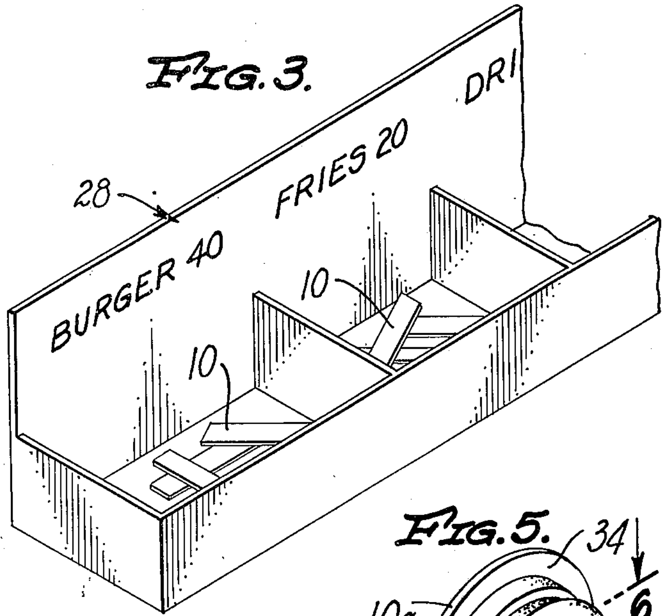
FIG. 3 shows a typical storage unit for a plurality of coded elements.
Figure 1:
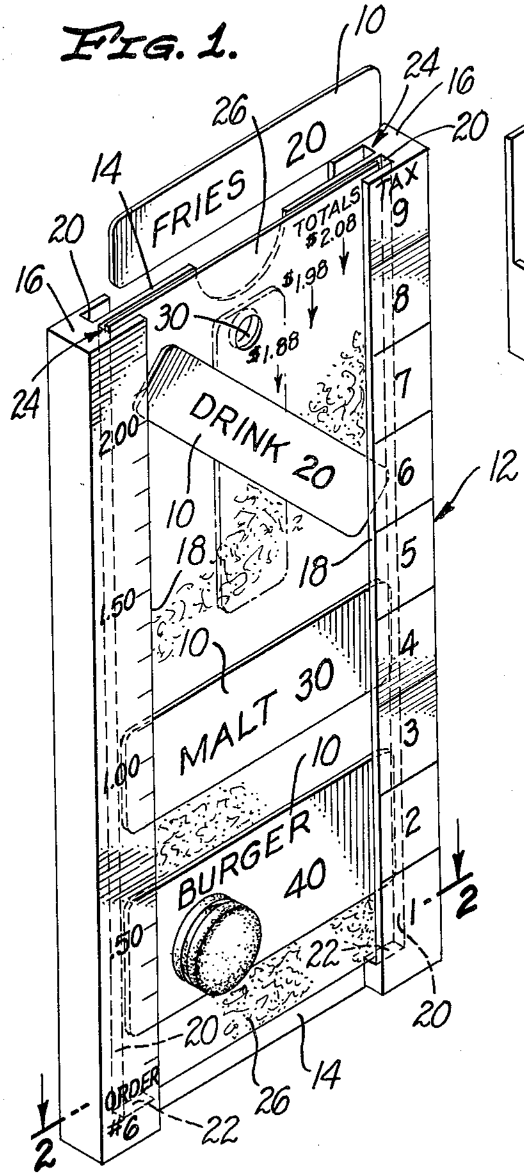
FIG. 1 is an isometric projection showing a presently preferred embodiment of the apparatus which may be used to practice an exemplary method of the invention.
Figure 2:
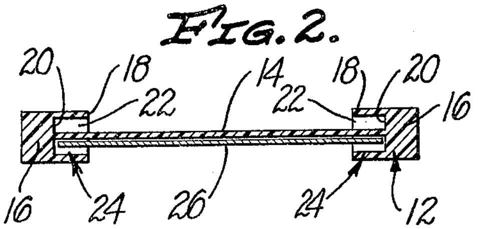
FIG. 2 is a sectional view taken along line 2—2 in FIG. 1.

The magnitude-coding of the elements may be accomplished by making the size of each element proportional to the predetermined number associated with that inventory item. An example of magnitude-coding by size is best shown in FIGS. 1–3 where the height dimension of each element is made proportional to the price of a food inventory item.

However, the invention also contemplates any other suitable way of magnitude-coding such as by numerals (see FIG. 1), weight, shape, color (see FIG. 7), as well as more sophisticated means such as by optical or magnetic coding.

Identity-coding of the elements may be accomplished in various ways, including by words, illustration, and three-dimensional representation, as shown in the drawing, as well as other suitable ways such as those suggested for magnitude-coding.

In order to facilitate the automated processing of a request for a selected group of inventory items, it may be desirable to use the same coding technique for both magnitude coding and identity coding. Thus, one embodiment of the invention could provide both identity indicia and magnitude indicia encoded magnetically in the elements, so that a single magnetic sensor could be used to sense both the identification and price of the inventory items associated with the group of elements selected by the customer.

In another embodiment, both the identity and magnitude indicia could be identical, such as where a smaller number of different inventory items is involved. Thus, the color green on an element might identify both the price and the identity of an inventory item.

Also, the invention contemplates that the magnitude and/or the identity indicia may take two forms, one form of indicia being designed for use by the customer in placing an order, and a different form of indicia in processing the order. For example, in the embodiment shown in FIGS. 1–3, the digits "20" or "30" on the elements constitute one form of magnitude coding recognized by a customer while making an order, while the height of the elements constitutes a different form of magnitude coding for purposes of sensing and totaling all the prices associated with the selected group of inventory items. Similarly, identity coding might include one form such as a three-dimensional representation for ordering purposes, and another form such as optical or magnetic patterns which are discerned when the order is processed.

Since the elements used in the embodiment of FIGS. 1–3 to identify each purchase are of different predetermined sizes and therefore unique weights, they can be separated from the composite and simply weighed as the end of any given period to determine total sales for that period. This eliminates the need of cash registers or receipts for totaling the dollar volume of sales.

The foregoing methods and variations thereof thus provide a way of obtaining and processing orders for an inventory of items such as food products by converting various individual elements, coded in a predetermined way to indicate the price and identity of inventory items, into a composite form which cooperates with a sensor to automatically total the price associated with the composite form. The errors, delay and inefficiency that usually accompany written or oral orders are therefore eliminated, while at the same time the coded elements themselves constitute a record of the identification and dollar volume of inventory items sold and distributed.

Referring more specifically to the drawing, the illustrated embodiment includes a plurality of elements 10 each having the same thickness and length, and magnitude-coded with a predetermined height proportional to a price associated with a particular inventory item. The price is also identified by numerals displayed on each element. Each element is also identity-coded by a word, pictorial illustration, or the like, identifying the corresponding inventory item.

A holder 12 includes a longitudinal backing plate 14 and a pair of retainers 16 on the side edges of the plate. Each retainer 16 has a front wall 18, side wall 20 and bottom wall 22 which together define a longitudinal slot 24 for receiving a group of elements 10. The front wall 18 of each retainer 16 is displaced from the backing plate 14 a distance slightly greater than the common thickness of the elements 10, and the side walls 20 of the retainers 16 are spaced from each other a distance slightly greater than the common length of the elements, in order to allow a group of elements to be sequentially aligned and retained in both longitudinal slots 24. The bottom wall 22 forms a terminal end of the slot 24 and abuts against the first element in the sequence. The front walls 18 are sufficiently displaced from each other so that any visual coding on the aligned elements can still be seen.

A scale calibrated in accordance with the proportion factor of the height of the elements 10 extends longitudinally on the holder 12 commencing at the bottom wall 22 so that the total price can be sensed automatically and immediately when a group of selected elements is sequentially aligned as a composite in the slot 24. In the illustrated embodiment, this scale is shown on one retainer, with an auxiliary sales tax scale on the other retainer, and a total scale may be displayed on the backing plate 14 to facilitate reading the total price for the transaction. Other indicia such as the 6 shown in FIG. 1 may be used on the holder 12 to identify the customer making the order.

Where it is desirable to keep a written receipt for record purposes a sheet 26 may be removably positioned against the bottom wall 22 and adjacent the sequentially aligned elements 10, such as between the elements and the backing plate 14. A record of the transaction may thus be made by marking the sheet along the top margin of the aligned elements. This recording process may be facilitated by displaying a scale and/or other pertinent information directly on the sheet. Thus, the method and device herein automatically converts the pricing indicia of individual inventory items into a total price receipt for the composite without the need of mental or machine calculation of one item at a time.

Of course, saving the coded elements provides an accurate, complete and easily decodable record of the dollar volume of sales and the quantity and identity of inventory items sold for any given period of time.

A storage unit 28 for the elements 10 includes individual compartments showing the identification and price of the inventory item associated with and represented by the element in that compartment.

In a typical transaction using the exemplary method and apparatus, a customer in the vicinity of storage bins 28 will be given a holder 12. Where desired, the holder will already have a sheet 26 inserted in the slots 24 and against the backing plate 14. The customer will then be able to leisurely choose food items as represented by the coded elements at his own preferred speed, changing his mind when desired, and discussing the menu with companions, all without taking up any time of the clerk or waitress. As soon as a final choice is made, the appropriate coded elements can be inserted in any sequence in aligned relationship abutting against the bottom wall 22 and between the overlying front wall 18 and the underlying sheet 26 and backing plate 14. The resulting combination of coded elements 10 and holder 12 constitutes an accurate representation of the customer order without any written or oral communication between the customer and clerk. The clerk then fills the order as discerned from the identity-coded information on the elements and also tabulates the total price from the appropriate scale as determined by the magnitude-code information on the elements.

An aperture 30 at the top of the plate 14 and sheet 26 may be employed to assure proper position of the sheet relative to the holder, while at the same time providing a hanger hole for mounting the holder while the customer order is being processed. When the order is filled and the money received, the sheet can be marked at the end of the aligned elements to record the selling price for the order. The coded elements can then be removed and held for safekeeping until such time as an accounting is made from such elements to determine the identity and dollar volume of items sold over any given period. Of course, the holders can be reused over and over again during an accounting period.

Figure 4:
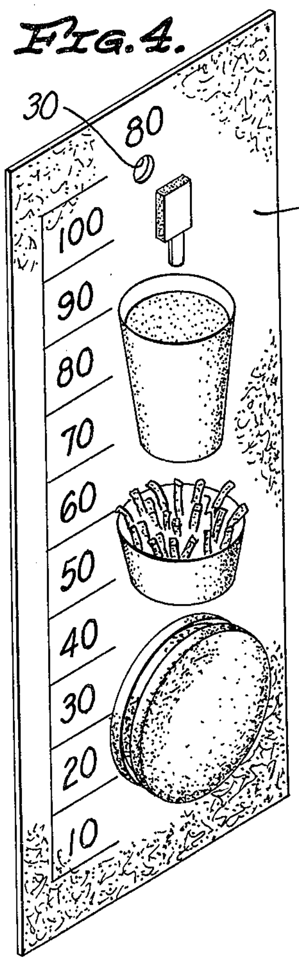
FIG. 4 shows a plurality of coded elements combined together into composite form.

Larger orders can be processed and filled by varying the conversion factor between the height of an element and the price of the associated inventory item. Also, additional retainers may be provided, such as on the reverse face of the plate 14 as shown in FIGS. 1–2. Another variation is provided by using a composite element 32 as shown in FIG. 4 wherein a standardized combination order is sold at a discount. Thus, the composite element 32 includes identity indicia for the items as well as discounted pricing indicia. The holder of FIGS. 1–2 would allow a composite element 32 to be inserted in one pair of retainers 16 while individual elements could be inserted in the other retainers.

Figure 5:
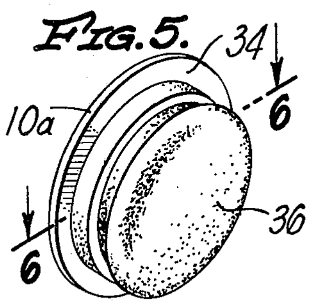
FIG. 5 shows an alternate form of a coded element.
Figure 6:
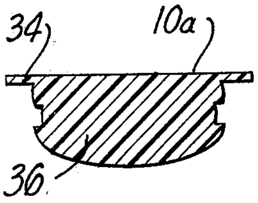
FIG. 6 shows a sectional view taken along line 606 in FIG. 5.

Manipulation of the individual elements as well as more imaginative identity coding is provided by element 10a, as shown in FIGS. 5-6, which includes a peripheral flange 34 sized and shaped to be received by slots 24, and a central raised portion 36 serving as both a handle as well as identity code information in the form of a three-dimensional representation of the associated inventory item.

Figure 7:
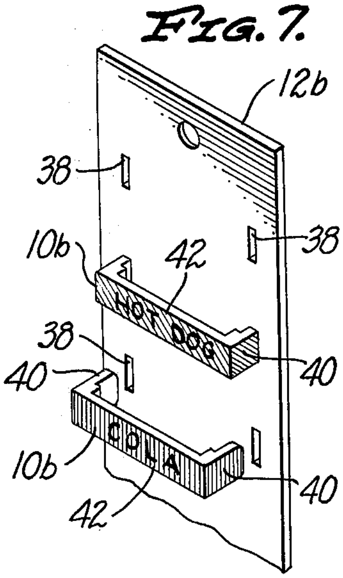
FIG. 7 is an isometric projection showing another embodiment of the invention.

It is within the spirit of the invention to vary the manner of coding of elements as well as the structure for retaining the selected group of coded elements together while their identity is being discerned and their total price sensed. Thus, for example, FIG. 7 shows a modified holder 12b having a plurality of openings 38 for removably mounting in longitudinal alignment a selected group of U-shaped elements 10b. Each element includes legs 40 which fit into the openings 38 as well as a center portion 42 for displaying identity-coding information such as the name of the associated inventory item, and magnitude coding information such as a unique color corresponding to the price of the item. Thus, an optical sensor could be used to determine the total price of the order while the particular food items named were being obtained for the customer.

Although exemplary embodiments of the invention have been disclosed and discussed, it will be understood that other applications of the invention are possible and that the embodiments may be subjected to various changes, modification, and substitutions without necessarily departing from the invention.

I claim as my invention:

1. A method of inventory distribution and control utilizing a plurality of coded elements separated from and corresponding to one of a predetermined inventory of items, each element being identity coded to provide a first indicium thereon representing the corresponding inventory items, and magnitude coded to provide a second indicium thereon indicating a predetermined magnitude associated with the corresponding inventory item, and utilizing a holding member for retaining together a group of said coded elements, said method comprising the steps of:

selecting a predetermined group of said elements;

positioning said predetermined group of elements in cooperative relationship on said holding member; and sensing the indicia on said predetermined group of elements to identify their corresponding inventory items and to read the sum of their magnitudes.

* * * * *